United States Patent [19]

Gaul et al.

[11] Patent Number: 5,217,919
[45] Date of Patent: Jun. 8, 1993

[54] METHOD OF FORMING ISLAND WITH POLYSILICON-FILLED TRENCH ISOLATION

[75] Inventors: Stephen J. Gaul; Donald F. Hemmenway, both of Melbourne, Fla.

[73] Assignee: Harris Corporation, Melbourne, Fla.

[21] Appl. No.: 854,805

[22] Filed: Mar. 19, 1992

[51] Int. Cl.[5] .............................................. H01L 21/76
[52] U.S. Cl. ........................................ 437/67; 437/72
[58] Field of Search ........................... 437/67, 72, 228; 148/DIG. 85, DIG. 86, DIG. 50, DIG. 135

[56] References Cited

FOREIGN PATENT DOCUMENTS 61-229339 10/1986 Japan ...................................... 437/67
63-244762 10/1988 Japan ...................................... 437/67

*Primary Examiner*—George Fourson
*Attorney, Agent, or Firm*—Evenson, Wands, Edwards, Lenahan & McKeown

[57] ABSTRACT

A process of manufacturing a trench-isolated semiconductor structure comprises forming a first 'pad' (e.g. MOS gate) oxide layer on a first surface of a silicon substrate. An oxide etch protective layer of silicon nitride is selectively formed on a first portion of the pad oxide layer so as to overlie a first surface portion of the silicon substrate in which active device regions will be introduced. A second oxide layer is then deposited on the pad oxide layer and on the nitride layer. The dual oxide layer is then patterned to form a trench mask which exposes a second surface portion of the silicon substrate. An etchant is then applied to the structure so as to etch away material from the silicon substrate exposed by the second surface portion and a portion of the second oxide layer, thereby forming a trench in the second surface portion of the silicon substrate. After any remaining portion of the second oxide layer is removed, local oxidation of the structure is performed so as to form a third oxide layer in the trench and a field oxide at surface portions of the substrate adjacent to the nitride layer. A layer of polysilicon is non-selectively deposited over the entire structure to fill the oxide-lined trench and then polished down to the nitride layer which serves as a polishing stop. The nitride is then stripped off the pad oxide in preparation for device region processing.

18 Claims, 2 Drawing Sheets

METHOD OF FORMING ISLAND WITH POLYSILICON-FILLED TRENCH ISOLATION

FIELD OF THE INVENTION

The present invention relates in general to the manufacture of semiconductor integrated circuits, and is particularly directed to a process for patterning a semiconductor substrate into a trench-isolated architecture having a layer of polysilicon filling a dielectrically coated trench structure.

BACKGROUND OF THE INVENTION

The formation of trench-isolated semiconductor circuit architectures customarily entails the planarization of one or more layers of material (usually containing at least one layer of dielectric, such as oxide material) atop the semiconductor substrate. In a trench-isolated structure, the overlay may also contain a layer of polycrystalline semiconductor material (e.g. polysilicon in the case of a silicon-based process), that has been non-selectively deposited on an oxide layer atop the trench-patterned wafer. The polysilicon fills the oxide coated trenches and piles up to some thickness on the top surface of the structure.

In order to prevent the planarization step, which typically involves the use of a chemical etching slurry containing a polishing grit material, from removing the actual substrate material beneath the overlay being polished, it is common practice to form a protective polishing-stop layer, such as silicon nitride, on that portion of the substrate to be protected. In the case of a CMOS integrated circuit architecture, for example, the protective layer may be disposed atop a relatively thin (e.g. on the order of several hundred angstroms) gate oxide layer and extend over an adjacent surface area of the substrate in which device regions (source and drain regions) are to be formed.

In accordance with a process previously developed by the assignee of the present application, the trench mask may be comprised of a sacrificial oxide layer formed atop the nitride layer, thereby forming, together with the pad oxide therebeneath, a triple layer laminate. This multi-layer laminate is selectively masked by a photoresist overlay and then the individual layers of the laminate are successively etched so as to define a patterning mask for the trench geometry of the substrate. Unfortunately, the use of such a multi-layer mask to trench-process the wafer is complicated and imprecise.

For example, the substantial and uneven thickness of the sacrificial oxide layer atop the nitride does not make it possible to readily define the point at which the nitride becomes exposed during selective etching of the thick oxide. Consequently, it may be necessary to employ a pilot wafer simply to measure the manner in which the sacrificial oxide is etched. Similarly, because of the reduced thickness of the pad oxide (only several hundred angstroms), identifying when to terminate the nitride etch is inexact.

An additional complication is the fact that, after the trench dielectric (oxide) layer is non-selectively deposited on the trench-patterned substrate, so as to coat the sidewalls and bottom surface of the trench, an excessive amount of this trench dielectric oxide may be removed during a following etch-down. The etching away of an excessive amount of trench oxide at the top or 'lip' of the trench may result in a substrate surface having poor step coverage after polysilicon deposition and subsequent planarization to expose the nitride 'stop' layer. Thus, although the substrate-protecting nitride layer may satisfactorily perform its planarization stop function, because of the necessity of precisely etching (an uneven oxide overlay) down to and through the nitride in the course of patterning the triple layer trench mask, a poly-filled, trench-isolated substrate realized through the use of such a mask may contain anomalies in its surface, particularly in the vicinity of the edges of the trenches.

SUMMARY OF THE INVENTION

In accordance with the present invention, the advantages of using a nitride protective and polishing stop layer within a triple layer mask laminate are retained without the above described problems of imprecise etchback and inadequate step coverage. To this end, rather than first non-selectively forming a triple layer laminate and then patterning the nitride-containing laminate to define the trench mask, the silicon nitride layer is selectively etched prior to depositing the sacrificial oxide overlay, such that the nitride layer does not have to be etched to define the mask aperture for the trench.

Specifically, the nitride layer, which serves as a protective and polishing stop layer, is formed atop a relatively thin pad oxide layer that overlies the active device area of the surface of the semiconductor material adjacent to which the trench pattern is to be formed. The semiconductor material may be a bulk substrate or a semiconductor layer overlying a support base layer, such as a dielectric base layer of sapphire or a dielectric (oxide) layer atop a semiconductor substrate. The nitride layer is then masked and etched to remove nitride material from the pad layer except where device regions are to be formed and to expose pad oxide material where a trench pattern is to be formed. A sacrificial dielectric (e.g. oxide) layer is then non-selectively deposited on the patterned nitride and adjacent pad oxide material. The thickness of the sacrificial oxide, which is densified prior to the trench etch, is such that this oxide layer is not completely etched through during subsequent etching of the substrate to the desired depth of the trench pattern and will depend upon its etch selectivity relative to that of the substrate.

The dual oxide layer is then patterned, so as to expose a surface portion of the substrate where the trench is to be formed. Using this patterned dual oxide trench mask, the resulting structure is then exposed to a trench etch, which both removes substrate material exposed by the trench pattern in the oxide mask and also oxide material of the densified sacrificial oxide layer. Once the trench topology has been defined in the exposed surface of the substrate, the sacrificial oxide layer is subjected to an oxide wash, to completely remove this oxide layer, so that the oxide is effectively stripped from the surface of the nitride layer and adjacent material, which may include some portion of the pad oxide beneath an edge portion of the nitride, as well as adjacent pad oxide.

The resulting structure is then subjected to a local oxidation (LOCOS) step, which converts a prescribed thickness of the exposed silicon substrate, namely a prescribed thickness of the silicon surface of the trench and silicon not covered by the nitride, to silicon oxide. During this LOCOS step a relatively thin and inconsequential oxide layer is formed atop the nitride layer. What results is an oxide-coated trench pattern and an overlay of silicon oxide dielectric atop the substrate adjacent to the nitride layer.

In accordance with a first embodiment of the present invention, a layer of polysilicon is then non-selectively deposited atop the oxide-coated, trench-patterned substrate, so that it fills the remaining portions of the trench and piles up atop the substrate and nitride layer. The structure is then planarized (e.g. using an etching slurry), so as to polish the polysilicon overlay down to the surface of the polishing stop nitride layer. The nitride layer is then stripped, to expose the underlying pad oxide for subsequent device formation processing.

In accordance with a second embodiment of the invention, for the formation of an MOS structure where the width of the trench will accommodate the required thickness of gate conductor, the nitride layer is not used as a planarizing stop. Instead, it is stripped prior to non-selectively depositing the layer of polysilicon atop the oxide-coated, trench-patterned substrate. As in the first embodiment the polysilicon is deposited so that it fills the remaining portions of the trench. It also piles up atop the substrate and the pad oxide layer. The polysilicon layer is then selectively masked so as to define the geometry of a gate conductor, overlying a gate area of the pad oxide. The patterned polysilicon is then subjected to a plasma etch, to remove unwanted areas of the polysilicon, typically such that the gate polysilicon conductor is not contiguous with the polysilicon refill in the trench. The plasma etch used to define gate poly also planarizes the trench refill poly. The patterned polysilicon may now be used as a self-alignment mask for the introduction (e.g. ion-implantation) of source and drain impurities into the adjacent areas of the substrate beneath the pad oxide.

DETAILED DESCRIPTION

Figure 1:
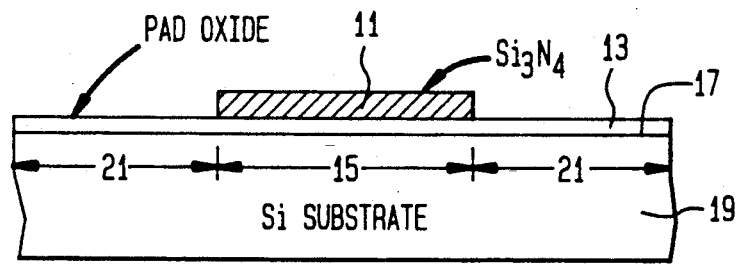
FIGS. 1-6 are diagrammatic illustrations of a trench-isolated integrated circuit architecture at respective steps of its manufacture in accordance with a first embodiment of the present invention.

Referring now to FIGS. 1-6 respective steps of the manufacture of a trench-isolated integrated circuit architecture in accordance with a first embodiment of the present invention will be described. Specifically, as shown in FIG. 1, a silicon nitride layer 11, which is to serve as a protective and polishing stop layer, is formed atop a relatively thin pad oxide layer 13 that overlies the active device area 15 of the top surface 17 of semiconductor material 19 adjacent to which a trench pattern is to be formed. Semiconductor material 19 may be a bulk silicon substrate or a silicon layer overlying a support base layer, such as a dielectric base layer of sapphire or a dielectric (oxide) layer atop a semiconductor substrate. For purposes of presenting a non-limitative example, nitride layer 11 may have a thickness on the order of one to three thousand angstroms, and pad oxide layer 13 may have a thickness on the order of several hundred angstroms. Silicon nitride layer 11 is masked and etched to remove nitride material from pad layer 13 except overlying region 15 within substrate 19 where device regions (e.g. source and drain and gate regions of a field effect transistor) are to be formed and to expose a region 21 of pad oxide material where a trench pattern is to be formed.

Figure 2:
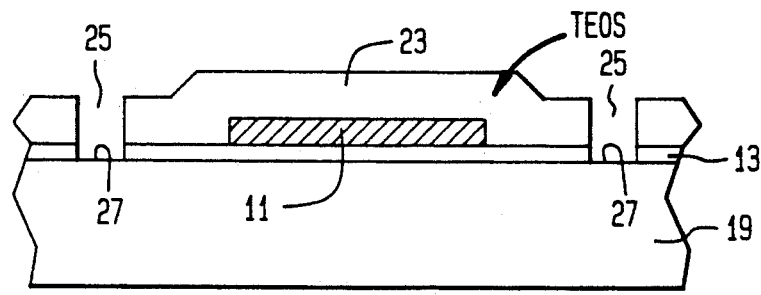

Next, as shown in FIG. 2, a sacrificial dielectric (e.g. oxide) layer 23 is non-selectively deposited on the patterned nitride layer 11 and adjacent exposed regions 21 of pad oxide material 13. Oxide layer 23 may comprise a low temperature deposited oxide layer. Because it is a deposited layer, sacrificial oxide layer 23 will have the same thickness on patterned nitride layer 11 and on the exposed pad oxide layer 13. As a consequence, during a subsequent trench oxide step, effectively the same amount of sacrificial oxide layer 23 will be removed from nitride layer 11 as from pad oxide layer 13. Sacrificial oxide layer 23 is densified, as necessary, prior to the trench etch, so as to increase its etch selectivity ratio relative to that of substrate 19 (e.g. on the order of 10:1 relative to a silicon layer). This will ensure that a sufficiently thick layer of sacrificial oxide 23 may be deposited on nitride layer 11 and oxide layer 13 to allow the desired trench pattern depth to be reached, while still leaving some sacrificial oxide. Namely, the thickness of the densified sacrificial oxide layer 23 is such that it is not completely etched through during subsequent etching of the substrate to the desired depth of the trench pattern. The dual oxide layer (pad oxide layer 13 and sacrificial oxide layer 23) is then patterned to form a trench aperture 25, which exposes a surface portion 27 of the surface 17 of substrate 19 where the trench is to be formed.

Figure 3:
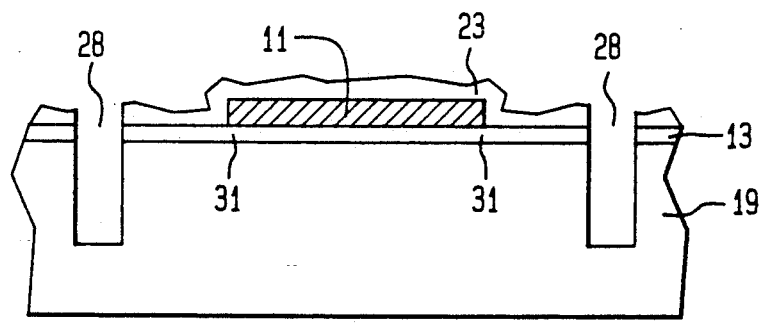

As shown in FIG. 3, using this patterned dual oxide trench mask, the resulting structure is then exposed to a trench etch, such as a dry etch based on chlorine chemistry which both removes substrate material exposed by the trench pattern 25 in the dual oxide mask and also oxide material of the densified sacrificial oxide layer 23. Once the trench topology 28 has been defined in the exposed surface of the substrate, the sacrificial oxide layer 23 is subjected to an oxide wash, to completely remove this oxide layer, so that the sacrificial oxide is effectively stripped from the surface of the nitride layer 11 and adjacent material, which may include some portion of the pad oxide 13 beneath an edge portion 31 of the nitride, as well as adjacent pad oxide.

Figure 4:
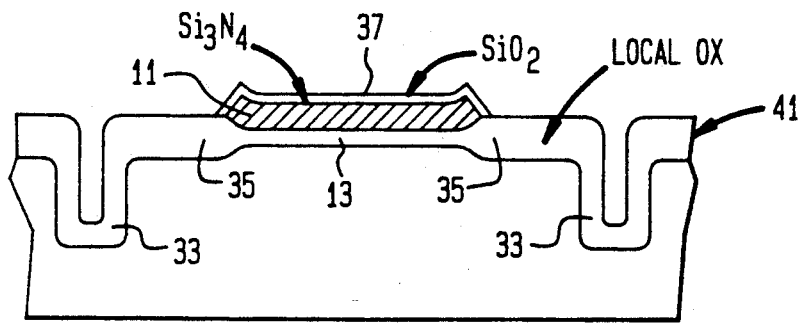

Then, as illustrated in FIG. 4, the resulting structure is subjected to a local oxidation (LOCOS) step, which grows a prescribed thickness of silicon oxide 33,35, in the range of 1000 to 20,000 Å, on the silicon surface of the trench 28 and on the silicon within region 21 not covered by the nitride. During this LOCOS step, a relatively thin (typical thickness on the order of several hundred angstroms) oxide layer 37 is formed atop the nitride layer 11. What results is an oxide-coated (portion 33) trench pattern 28 and an overlay 35 of silicon oxide dielectric atop the substrate adjacent to the nitride layer 11.

Figure 5:
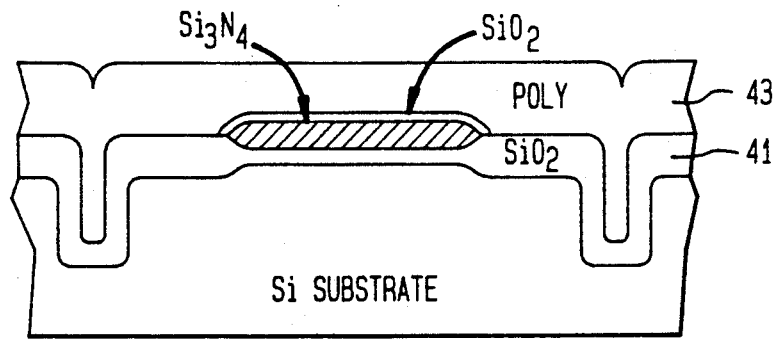
Figure 6:
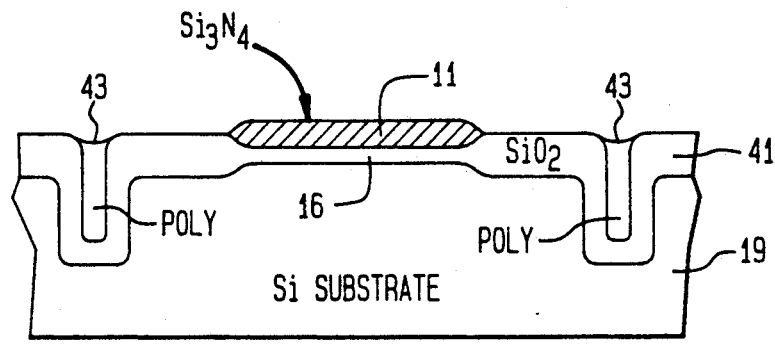

In accordance with a first embodiment of the present invention, a layer of polysilicon 43 is then non-selectively deposited atop the oxide-coated, trench-patterned substrate, so that it fills the remaining portions of the oxide-lined trench 28 and piles up atop the substrate and nitride layer, as shown in FIG. 5. The structure is then planarized (e.g. using an etching slurry such as KOH/silica slurry), so as to polish the polysilicon overlay 43 down to the surface of the polishing stop nitride layer 11, as shown in FIG. 6. The silicon nitride layer 11 is then stripped, for example using hot phosphoric acid, so to expose the underlying portion 16 of pad oxide 13 overlying portion 15 of substrate 19, for subsequent device formation processing.

As a modification of the first embodiment of the present invention, depending upon the thickness of surface portion 35 of LOCOS oxide layer 41, after polysilicon layer 43 has been planarized, but prior to stripping off nitride layer 11, a further oxidation step may be carried out so as to increase the thickness of the substrate surface oxide to the required (field) thickness (e.g. on the order of one micron).

Figure 7:
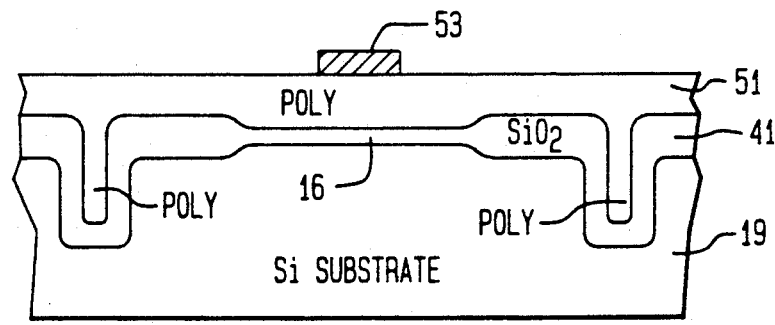
FIGS. 7 and 8 are diagrammatic illustrations of a modification of the trench-isolated integrated circuit architecture of FIGS. 1-6 at respective steps of its manufacture in accordance with a second embodiment of the present invention.

In accordance with a second embodiment of the invention, for the formation of an MOS structure where the width of the trench will accommodate the required thickness of a gate conductor, active area-protecting nitride layer 11 is not used as a planarizing stop. Instead, it is stripped prior to non-selectively depositing the layer of polysilicon atop the oxide-coated, trench-patterned substrate. More particularly, as shown in FIG. 7, similar to the first embodiment, a layer of polysilicon 51 is deposited so that it fills the remaining portions of the trench and piles up atop the substrate and the pad oxide layer. Polysilicon layer 51 is then selectively masked with a patterned photoresist layer 53, rather than being directly planarized.

Figure 8:
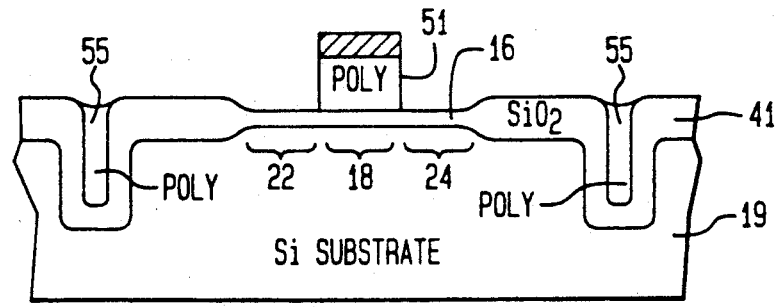

Next, as illustrated in FIG. 8, polysilicon layer 51 is etched, so as to define the geometry of a gate conductor overlying a gate area 18 of the pad oxide 13 and exposing adjacent areas 22, 24 of the underlying pad oxide for subsequent (MOS) device processing. The patterned polysilicon (gate) layer 53 may now be used as a self-alignment mask for the introduction (e.g. ion-implantation) of source and drain impurities into the adjacent areas 22, 24 of the substrate beneath the pad oxide. The patterned polysilicon defined typically such that the gate polysilicon conductor is not contiguous with the polysilicon refill 55 in the trench 28.

As will be appreciated from the foregoing description of the present invention, the advantages of using a nitride protective as a polishing stop layer within a triple layer mask laminate are retained without the problem of imprecise etchback and inadequate step coverage. In each embodiment, the silicon nitride layer is selectively etched prior to depositing the sacrificial oxide overlay, such that the nitride layer does not have to be etched to define the mask aperture for the trench. In the first embodiment, the nitride layer is not stripped until after polysilicon planarization. In accordance with a second embodiment, the nitride is stripped prior to polysilicon deposition to allow the polysilicon to be patterned into a gate mask.

While I have shown and described several embodiments in accordance with the present invention, it is to be understood that the same is not limited thereto but is susceptible to numerous changes and modifications as known to a person skilled in the art, and I therefore do not wish to be limited to the details shown and described herein but intend to cover all such changes and modifications as are obvious to one of ordinary skill in the art.

What is claimed:

1. A method of manufacturing a semiconductor structure comprising the steps of:
   (a) providing a semiconductor substrate;
   (b) forming a first dielectric layer on a first surface of said semiconductor substrate;
   (c) selectively forming a second dielectric layer on a first portion of said first dielectric layer;
   (d) forming a third dielectric layer on said first and second dielectric layers;
   (e) patterning a selected portion of said first and third dielectric layers, so as to expose a second surface portion of said semiconductor substrate;
   (f) removing material from said semiconductor substrate exposed by said second surface portion, so as to form a trench in said second surface portion of said substrate;
   (g) removing said third dielectric layer;
   (h) forming a fourth dielectric layer in said trench and on exposed portions of said first dielectric layer resulting from step (g); and
   (i) forming semiconductor material on said fourth dielectric layer in said trench.

2. A method according to claim 1, wherein step (i) comprises non-selectively forming said semiconductor material on the structure resulting from step (h), so that said semiconductor material fills said trench and overlies said second and fourth dielectric layers.

3. A method according to claim 2, further comprising the step of:
   (j) removing semiconductor material formed in step (i) so as to expose said second dielectric layer.

4. A method according to claim 2, further comprising the step of:
   (j) removing semiconductor material formed in step (i) so as to effectively planarize the top surface of said structure.

5. A method according to claim 1, wherein step (g) further includes removing said second dielectric layer, and step (h) comprises forming said fourth dielectric layer in said trench and on exposed portions of said first dielectric layer resulting from step (g), and wherein step (i) comprises non-selectively forming semiconductor material on the structure resulting from step (h).

6. A method of manufacturing a semiconductor structure comprising the steps of:
   (a) providing a semiconductor substrate;
   (b) forming a first dielectric layer on a first surface of said semiconductor substrate;
   (c) selectively forming a second dielectric layer on a first portion of said first dielectric layer;
   (d) forming a third dielectric layer on said first and second dielectric layers;
   (e) patterning a selected portion of said first and third dielectric layers, so as to expose a second surface portion of said semiconductor substrate;
   (f) removing material from said semiconductor substrate exposed by said second surface portion, so as to form a trench in said second surface portion of said substrate;
   (g) removing said third dielectric layer;
   (h) forming a fourth dielectric layer in said trench and on exposed portions of said first dielectric layer resulting from step (g);
   (i) removing said second dielectric layer; and
   (j) forming semiconductor material on said fourth dielectric layer in said trench.

7. A method according to claim 6, wherein step (j) further comprises selectively forming said semiconductor material on that portion of said first dielectric layer from which said second dielectric layer has been removed in step (i).

8. A method according to claim 6, wherein step (j) comprises non-selectively forming said semiconductor material on the structure resulting from step (i), so that said semiconductor material fills said trench and overlies said first and fourth dielectric layers.

9. A method of manufacturing a semiconductor structure comprising the steps of:
   (a) providing a silicon substrate;
   (b) forming a first oxide layer on a first surface of said silicon substrate;
   (c) selectively forming an oxide etch protective layer on a first portion of said first oxide layer;
   (d) forming a second oxide layer on said first oxide layer and on said oxide etch protective layer;
   (e) patterning a selected portion of said first and second oxide layers, so as to form a trench mask which exposes a second surface portion of said silicon substrate;
   (f) applying an etchant to the structure resulting from step (e) so as to etch away material from said silicon substrate exposed by said second surface portion and a portion of said second oxide layer, thereby forming a trench in said second surface portion of said silicon substrate;
   (g) removing remaining portions of said second oxide layer;
   (h) performing local oxidation of the structure resulting from step (g) so as to form a third oxide layer in said trench and at surface portions of said substrate adjacent to said oxide etch protective layer; and
   (i) non-selectively forming a polysilicon layer on the structure resulting from step (h).

10. A method according to claim 9, further including the step of (j) removing a portion of the polysilicon formed in step (i) so as to expose said oxide etch protective layer.

11. A method according to claim 10, further comprising the step of:
   (j) removing polysilicon material formed in step (i) so as to effectively planarize the top surface of said structure.

12. A method according to claim 9, wherein said oxide etch protective layer comprises silicon nitride.

13. A method according to claim 9, wherein step (i) further includes removing said oxide etch protective layer and then non-selectively forming polysilicon on the resulting structure.

14. A method according to claim 9, wherein step (i) further includes removing said oxide etch protective layer and then selectively forming polysilicon on the resulting structure, the polysilicon overlying the first portion of said first oxide layer.

15. A method of manufacturing a semiconductor structure comprising the steps of:
   (a) providing a silicon substrate;
   (b) forming a first oxide layer on a first surface of said silicon substrate;
   (c) selectively forming an oxide etch protective layer on a first portion of said first oxide layer;
   (d) forming a second oxide layer on said first oxide layer and on said oxide etch protective layer;
   (e) patterning a selected portion of said first and second oxide layers, so as to form a trench mask which exposes a second surface portion of said silicon substrate;
   (f) applying an etchant to the structure resulting from step (e) so as to etch away material from said silicon substrate exposed at said second surface portion and a portion of said second oxide layer, thereby forming a trench in said second surface portion of said silicon substrate;
   (g) removing remaining portions of said second oxide layer;
   (h) performing local oxidation of the structure resulting from step (g) so as to form a third oxide layer in said trench and at surface portions of said substrate adjacent to said oxide etch protective layer; and
   (i) removing said oxide etch protective layer; and
   (j) forming polysilicon material on said third oxide layer in said trench.

16. A method according to claim 15, wherein step (j) comprises selectively forming said polysilicon material on the first portion of said first oxide layer from which said oxide etch protective layer has been removed in step (i).

17. A method according to claim 15, wherein step (j) comprises non-selectively forming said polysilicon material on the structure resulting from step (i), so that said polysilicon material fills said trench and overlies said first and third oxide layers.

18. A method according to claim 15, wherein said oxide etch protective layer comprises silicon nitride.

* * * * *